US006799428B1

(12) United States Patent
Stollenwerk

(10) Patent No.: US 6,799,428 B1
(45) Date of Patent: Oct. 5, 2004

(54) HEAT EXCHANGER

(76) Inventor: Michael Stollenwerk, Holzbüttgener Strasse 18a, D-41462 Neuss (DE)

( * ) Notice: Subject to any disclaimer, the term of this patent is extended or adjusted under 35 U.S.C. 154(b) by 689 days.

(21) Appl. No.: 10/031,896

(22) PCT Filed: Jul. 12, 2000

(86) PCT No.: PCT/DE00/02328

§ 371 (c)(1),
(2), (4) Date: Jan. 22, 2002

(87) PCT Pub. No.: WO01/07858

PCT Pub. Date: Feb. 1, 2001

(30) Foreign Application Priority Data

Jul. 22, 1999 (DE) .......................................... 199 34 554

(51) Int. Cl.$^7$ ............................................... F25B 21/02
(52) U.S. Cl. ........................... 62/3.7; 165/180; 165/185
(58) Field of Search ...................... 62/3.7, 3.2; 165/185, 165/146, 80.3, 133; 361/382, 386, 388

(56) References Cited

U.S. PATENT DOCUMENTS 3,598,896 A * 8/1971 Hassler ......................... 174/52
4,795,618 A * 1/1989 Laumen ....................... 422/202
4,981,172 A * 1/1991 Haerle ......................... 165/133

FOREIGN PATENT DOCUMENTS

| DE | 1639436 | 2/1971 |
| DE | G9102117 | 10/1991 |
| EP | 0559092 | 9/1993 |
| WO | WO9909594 | 2/1999 |

* cited by examiner

Primary Examiner—Melvin Jones
(74) Attorney, Agent, or Firm—Horst M. Kasper

(57) ABSTRACT

Heat exchanger, which has a cooling body (9) that is in contact with a medium (11) to be cooled, on the one hand, and with a cooling medium (20), on the other hand, and transfers the heat of the medium to be cooled to the cooling medium, whereby the cooling body is composed of at least two materials, of which one is a better conductor of heat than the other, and the material of better thermal conductivity is essentially in contact with the medium to be cooled and dissipates the heat from the latter to the material of poorer thermal conductivity, which is essentially in contact with the cooling medium, to which for its part it transfers the heat, and the cooling body furthermore has sintered parts that form a porous sintered structure through which the cooling medium can flow, sintered parts being composed of the material of better thermal conductivity and of the material of poorer thermal conductivity, and the sintering temperature of the material of better thermal conductivity being less than or equal to the temperature of the material of poorer thermal conductivity.

23 Claims, 6 Drawing Sheets

HEAT EXCHANGER

Figure 1:
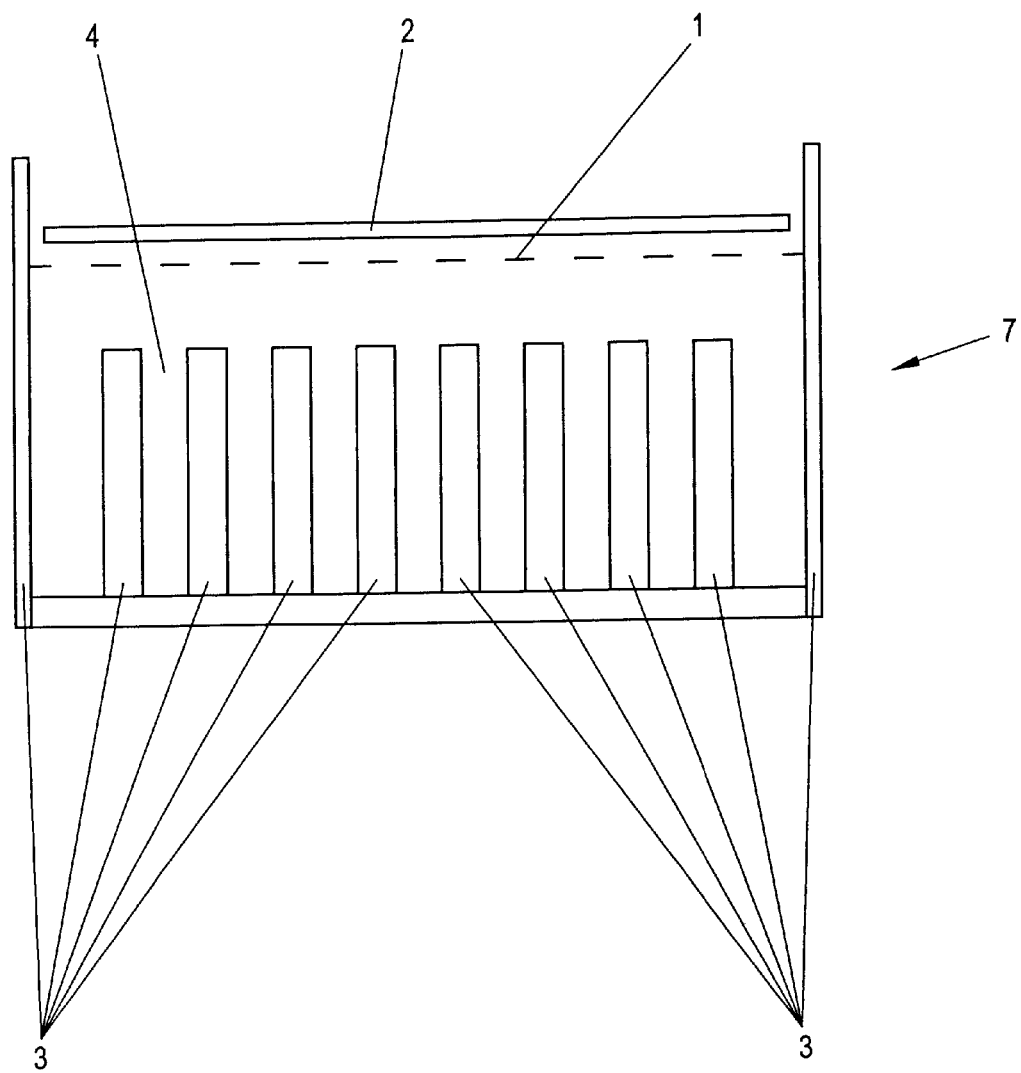

The present invention relates to heat exchangers and to methods for producing them.

The prior art includes heat exchangers used as cooling bodies in the form of rib profiles for instance, which are preferably produced from aluminium. However, their cooling performance is limited by the maximum achievable ratio of cooling-body surface area to cooling-body volume.

Heat exchangers made of porous foamed metal that are intended to remedy this deficiency have furthermore been disclosed by EP 0 559 092, for instance. Admittedly, they achieve a better ratio of cooling-body surface area to cooling-body volume but this is at the expense of poorer heat conduction with larger pores. However, if smaller pores are chosen, resistance to the flow of the incoming cooling medium increases too sharply.

Sintered blocks of the type known from German Utility Model G 91 02 117 have similar disadvantages. Here too, good thermal conductivity can only be achieved through sufficiently fine-grained sintered material and this in turn leads to a heat exchanger with an undesirably high flow resistance.

These solutions are therefore only feasible if use is made of a liquid cooling medium that provides adequate heat dissipation even with relatively large pores. However liquid cooling entails a not inconsiderable outlay on bringing in and carrying away the cooling fluid and cleaning it or holding it ready in an intermediate circuit. Owing to the associated costs, their use is therefore generally restricted to cases where this is unavoidable.

WO 99/09594 attempts to obviate these disadvantages by means of a particular geometric configuration by proposing a sintered cooling body that has a sintered body with a meandering structure and thereby enlarges the areas of inflow and outflow of the cooling medium to and from the sintered body, thus reducing the flow resistance of the heat exchanger and thereby enabling it to be used for gaseous cooling media as well.

However, the subject matter of WO 99/09594 has a crucial disadvantage. The meandering shape of the actual sintered body leads to adjacent passages that are separated only by the sintered body itself both on the side where the cooling medium flows in and on the side where it flows out. The passages on the side where the cooling medium flows in leads to an unwanted effect here. These passages are not only bounded by a wall of the sintered body on their sides facing the outflow passages but are also separated from the outflow side of the heat exchanger at their respective ends by a piece of sintered body. These inflow passages thus form a kind of nozzle, in which the inflowing medium first of all reaches the end of the passage and there tries to pass through the wall of sintered material with which the passage ends. Only if the flow resistance there is too high does cooling medium also pass through the side walls of the passage, first of all through the side pieces closest to the end piece of the passage and then through the parts further away from the latter as the pressure increases.

This is extremely unsatisfactory since, although the heat exchanger according to WO 99/09594 thus provides a favourable ratio of cooling-body surface area to cooling-body volume overall, an inflowing cooling medium cannot use this overall surface area made available for heat dissipation at all since only a small part of it comes into contact with this overall surface area. Instead, the small end piece of the sintered body in the inflow passage receives the majority of the inflowing cooling medium but cannot release as much heat to it as it could absorb owing to the small contact surface in its area. The side walls of the sintered body in the outflow passage, on the other hand, receive only an inadequate supply of cooling medium and, for their part, cannot therefore make use of the surface area available here for heat dissipation.

This disadvantage thus restricts the utility of the heat exchanger according to Wo 99/09594, especially where the inflow velocity of the cooling medium used is considerable.

DE-B 1 639 436 has furthermore disclosed a solution that attempts to improve the thermal conductivity of sintered bodies by disclosing a sintered body that is composed of a compacted mixture of metals comprising metals of poorer and better thermal conductivity. Here, however, the improvement in thermal conductivity is achieved at the expense of reducing the cooling surface area since the sintered body is compacted and its porosity severely reduced or even eliminated, thus of course also reducing the surface area of the body.

However, eliminating the porosity is disadvantageous for other reasons too. This is because the porous structure leads to turbulent flow of the cooling medium in the cooling body since it leads to an adequate increase in the velocity of flow. With increasing velocity, there is a transition from initially laminar flow to turbulent flow at what is referred to as the critical Reynolds' number. Without this structure, on the other hand, the velocity of flow would not rise and the flow would remain laminar. In laminar flow, the cooling medium particles move on parallel paths. The streamlines run adjacent to one another. There is no mixing along the flow path. Friction leads to a velocity profile in each flow. Particles in contact with the wall adhere to it. Velocity rises with increasing distance from the wall. The profile of laminar flow rises gently. For laminar flow in a tube, it is parabolic. In the case of the desirable turbulent flow, on the other hand, the particles perform additional random and irregular transverse movements superimposed on the forward motion. They interweave in the flow. The medium is continuously being mixed along the flow path. The type of flow thus has a decisive effect on heat transfer by convection. In the case of laminar flow, the heat passes from within the substance flow to the wall or vice versa purely by heat conduction in the medium. In turbulent flow heat transport is not dependent solely on conduction. The mixing motion of the particles results in a material exchange of liquid or medium transversely to the flow and hence to direct heat transport. This is many times more than that for pure heat conduction within the medium. Pure heat conduction allows only the laminar boundary layer to be bridged. Heat transfer is therefore many times better with turbulent flow than with laminar flow. It increases as the velocity of flow rises. It can be improved by measures (e.g. roughening the surface) that disrupt or reduce the laminar boundary layer.

Compacting a cooling body by means of pressure as described in the abovementioned publication is thus not desirable but is counter productive since it eliminates or reduces the porosity of the cooling body and, as a consequence, also hinders the formation of turbulent flow that promotes heat dissipation and reduces the area available for cooling to an undesirable extent.

The object for the person skilled in the art is therefore to specify a heat exchanger which, while having a favourable ratio of cooling-body surface area to cooling-body volume and as low a flow resistance as possible, nevertheless has good thermal conductivity.

This object is achieved by means of a heat exchanger, which has a cooling body that is in contact with a medium to be cooled, on the one hand, and with a cooling medium, on the other hand, and transfers the heat of the medium to be cooled to the cooling medium, characterized in that the cooling body is composed of at least two materials, of which one is a better conductor of heat than the other, and the material of better thermal conductivity is essentially in contact with the medium to be cooled and dissipates the heat from the latter to the material of poorer thermal conductivity, which is essentially in contact with the cooling medium, to which for its part it transfers the heat, and the cooling body furthermore has sintered parts that form a porous sintered structure through which the cooling medium can flow, sintered parts being composed of the material of better thermal conductivity and of the material of poorer thermal conductivity, and the sintering temperature of the material of better thermal conductivity being less than or equal to the temperature of the material of poorer thermal conductivity.

There is furthermore the problem of the unwanted formation of a layer (patina), which can considerably prejudice heat transfer. This will be explained in greater detail below with reference to an example, namely the formation of an unwanted layer on copper. The problem of layer formation is also found in other cases, however, on aluminium for example, which has a high affinity with oxygen, and the following remarks thus apply also to this material. On bright surfaces such as those on copper, the action of substances contained in air and of moisture also leads to the formation of blooms composed, for example, of copper oxide. Within a few hours, these layers, which are initially only very thin, are 2 to 4 $\mu$m thick and therefore still almost invisible but, as time progresses they become thicker and can reach thicknesses of between 50 and 100 $\mu$m and more. With increasing thickness and density, the growth of the oxide layer slows. In the case of copper, the growth of the layer is evident from its colour. Starting with bright copper, the colour initially changes to dark brown as the layer gets thicker, then to dark green and finally to bright green. In contrast to the verdigris, which is caused by the chemical reaction between copper and acetic acid and is insoluble in water, this process results from the effect of atmospheric weathering. The layer that forms is called a patina and its chemical composition depends on the prevailing atmospheric conditions. At different geographic locations, the patina can be composed essentially of basic copper sulphate, basic copper chloride or basic copper carbonate. Under different operating conditions, this can also give rise to a very unfavourable chemical composition of the patina but the problems associated with this will not be explored further here. As a covering layer, the patina is known as a protective layer for the copper and its protective action is also independent of its chemical composition. The covering layer slows down the corrosion rate of bright copper considerably. The patina is itself very stable and immediately reforms if damaged. Although the formation of the patina is positive and desirable for corrosion resistance, it is disadvantageous for the exploitation of other physical properties, such as the thermal conductivity of copper in atmospheric media and under the influence of other media that do not prevent the formation of a protective layer or indeed promote it. Such patinas should therefore be avoided in the case of heat exchangers. Nevertheless, cooling the heat exchanger with air leads to the problem that there is increasing layer formation with increasing humidity. Especially in the case of cooling in kitchen areas, for example, heat exchangers are exposed to high air humidity. In the worst case, heat exchangers are not in continuous use, with the result that a cold heat exchanger may even be exposed to the problems associated with condensed water in unfavourable ambient conditions. In beverage-cooling systems too, extreme humidity levels must be expected by the very nature of the systems involved. The improvement in heat exchange brought about by porosity is thus lost again over the course of time through this effect of the formation of a protective layer. The performance of the heat exchanger gradually decreases more and more here.

Since, unlike the water-soluble verdigris, the patina can be removed only with difficulty and regular removal of this patina from copper leads to immediate reformation, cleaning is virtually out of the question for this purpose. This problem is worse with sintered heat exchangers, given their high porosity and large surface area. Given the heat-exchanger porosity desired here, removal of the patina is virtually impossible.

Admittedly, a certain degree of success can be achieved by geometrically skilful construction of the cooling body. This is because the frequency and duration of films of water on the surface of the copper has a significant influence on the rate of oxidation. Surfaces that have a shallow slope or are even horizontal, for instance, exhibit much faster oxidation than steep or vertical surfaces since, with the latter, deposits can at least run off and they tend therefore to be drier. If the cooling body is therefore mounted vertically on the heat-emitting surface in a heat exchanger, rapid drainage does at least occur in the event of penetration by moisture or a moist cooling medium, and this provides a certain improvement. However, this solution can only slow down the problem of layer formation; it cannot prevent it.

The grade or strength condition of the copper, on the other hand, has no effect on the patina. A special choice of material is therefore no solution to the problem in the case of copper.

According to the invention, metals can be used as heat-conducting materials to solve this problem, with a metal that is more noble than the material of poorer thermal conductivity being used as the material of better thermal conductivity, and a less noble metal than the material of better thermal conductivity being used as the material of poorer thermal conductivity. The more noble metal of better thermal conductivity then protects the less noble metal of poorer thermal conductivity from layer formation and thus achieves two things simultaneously by synergy, namely improvement of heat dissipation in the cooling body and protection of the less noble metal.

Silver can preferably be used as the material of better thermal conductivity and copper can preferably be used as the material of poorer thermal conductivity.

Sintered parts are particularly easy to produce in virtually all forms required. In this context, the term "sintering temperature" refers to the temperature at which the material begins to sinter, i.e. the granular starting materials begin to fuse at their grain boundaries and, in the process, form bonds, referred to as "sintering necks". In the case of a mixed structure consisting of two sintered materials, the structure comprising the material of poorer thermal conductivity, copper for instance, now forms the supporting structure for the likewise sintered material of better thermal conductivity, silver. Thus it is possible to build up material structures in which a smaller quantity of the material of better thermal conductivity, which is generally also much more expensive, is used to carry the heat away from the medium to be cooled into the cooling-body structure as quickly as possible and distribute it in the cooling body. Here in the cooling-body structure, heat dissipation to the cooling medium can then be taken over by a larger quantity of the material of poorer thermal conductivity, which is generally much cheaper, preferably copper. However, a prerequisite for this is that it should be possible, in a sintering process, to build up the supporting structure consisting of the material of poorer thermal conductivity first and that it should then be possible to sinter the material of better thermal conductivity into this supporting structure. For this purpose, it is necessary for the sintering temperature of the material of better thermal conductivity to be less than or equal to the sintering temperature of the material of poorer thermal conductivity since otherwise the supporting structure would melt in the furnace during the second sintering process and thus be useless.

The sintering temperature depends essentially on the melting point of the material used, its grain size and the desired shape of the sintering necks. However, if the melting point of the material of better thermal conductivity is sufficiently far below the melting point of the material of poorer thermal conductivity, it is generally possible to create the conditions required for the above-described sintering of two materials since there is then sufficient freedom for the sintering temperatures.

This applies particularly to silver and copper since silver has a melting point of about 961° C. and copper has a melting point of about 1083° C., and silver already begins to sinter at about 200° C.

The proportion of the material of better thermal conductivity in the cooling body per unit volume of the sintered cooling-body parts preferably decreases with increasing distance from the medium to be cooled since here the increasing quantity of material of poorer thermal conductivity then gradually takes over conduction of the heat, which has already been well distributed by the material of better thermal conductivity.

The cooling body can also have a shaped structure, preferably a passage structure, composed of the material of better conductivity, which distributes the heat into the cooling body, preferably in a uniform manner. Such an embodiment further improves rapid heat dissipation and subsequent distribution in the cooling body and, in particular, also makes it possible to choose cooling-body geometries that are not suitable or not very suitable for a uniform transition between the two heat-conducting materials away from the medium to be cooled.

The material of better thermal conductivity preferably follows the supporting structure along all its shape features, i.e. for instance along shaped passage, column, cone or conical-part structures of the type that are used, for instance, for uniform distribution of the cooling medium in the cooling body, and thus also improves its heat-dissipating and heat-distributing function. The shape (that is to say, for instance, the configuration of the mould for the furnace) for the second sintering process must be adapted to the shape of cooling body composed of the material of poorer thermal conductivity obtained from the first shaping sintering process. It restricts freedom of shaping in the second sintering process. For the shaping in the second sintering process, the mould chosen will preferably follow the structure of the mould for the first sintering process but will still leave some room for the material of better thermal conductivity which is then to be sintered. However, a freely shaped structure that uses the supporting structure merely as a foundation surface may also be chosen.

In a particularly preferred embodiment of the present invention, the proportion of the material of better thermal conductivity per unit volume of the sintered cooling-body parts decreases with increasing distance from the shaped structure composed of the material of better thermal conductivity. In this case, the passages composed of material of better thermal conductivity conduct the heat initially away from the medium to be cooled and then distribute it by means of a continuous transition between materials at any point in the cooling body where the geometrical conditions allow this.

The cooling body can also have a passage structure for guiding the cooling medium, which distributes the cooling medium in the cooling body. This should preferably be implemented in such a way that the cooling medium is distributed as uniformly as possible over the cooling body. In one embodiment according to the present invention, the cooling body can be penetrated by the passage structure.

The passage structure can also have curved passages. It can likewise have passages from which, in turn, passages branch off, these, in turn, having branching off from them passages, from which again passages branch off, thus giving rise to a branched structure which as far as possible branches out into all parts of the cooling body. A structure of passages that has passages that branch in this way and simultaneously curve has been found to be particularly advantageous. This applies to a greater degree to the porous cooling bodies described here. If the cooling body itself is porous, then, although the cooling medium essentially always follows the curvature of the passage in the curved passages, it always penetrates to a certain extent into the porous structure of the cooling body itself at the side of the passage boundary, against which it continuously flows owing to the curvature, and in this way is already distributed in the cooling body along the passages on its way through the passages themselves.

The cooling body can also have columns, the spaces between which essentially form the passage structure. Cones or conical parts, the spaces between which essentially form the passage structure, are also conceivable, it being possible for the tip or flattened tip of these cooling-body cones or conical cooling-body parts all to point in the same direction or to be arranged in such a way that the tip or flattened tip of immediately adjacent cooling-body cones or conical cooling-body parts, when viewed as a pair, point in opposite directions.

These structures force the inflowing cooling medium to meander through the cooling body and thus to distribute itself uniformly over the entire cooling body.

Any desired combination of the above heat dissipation options is, of course, also possible, using shaped structures, on the one hand, and structures that merge into one another, on the other hand, in order to be able in this way to adapt the heat exchanger as well as possible to the geometrical dimensions for the cooling body to be used, which are generally predetermined by external factors (such as a lack of space).

With the aid of such a cooling-body structure, even the meandering cooling bodies taught by WO 99/09594 can be improved to such an extent that uniform heat distribution in the cooling body is achieved even with their geometry by embodying the sintered cooling body in the region of the ends of the inflow passages in such a way that, in this region, it has a high proportion of material of better thermal conductivity, which then decreases along the side walls of the inflow passages in favour of the material of poorer thermal conductivity. Passages embodied as shaped structures composed of material of better thermal conductivity away from the end piece of the passages and towards the side walls are capable of improving this even further.

These heat exchangers constructed in accordance with the invention are also suitable, in particular, for performing cooling functions in which cooling is required only at, preferably short, intervals or only irregularly or only for a limited, preferably short, duration. In these cases, rapid transmission of the heat into the cooling body, where it is then finally dissipated by the cooling medium, leads in many cases to a situation where it is possible to dispense with a fan if the cooling body is of sufficiently large dimensions, by far the largest part being composed of the material of poorer thermal conductivity, this then acting as it were as a temporary heat store. The elimination thus achieved of a fan represents not only a cost advantage but also an advantage as regards reduced power consumption and lower noise generation. In cases where it is not possible to dispense with a fan completely, however, a heat exchanger in accordance with the present invention often allows it to be made considerably smaller than would have been possible without such a heat exchanger.

The heat exchangers according to the invention produced from a combination of materials, namely a material of poorer thermal conductivity and a material of better thermal conductivity exhibit considerably better performance overall since the material of better thermal conductivity distributes the heat more quickly in the cooling body to the material of poorer conductivity, which can then release the heat to the cooling medium owing to its larger volume, however. This effect is particularly clear from the example of copper and silver, the coefficient of thermal conductivity of which is 384 in the case of copper and 407 in the case of silver, although, at the same time, the price of silver is many times that of copper. Only a small quantity of expensive silver is therefore required here in order to distribute the heat to a large volume of copper, which then releases it to the cooling medium. A glance at the relative conductivity of other materials shows that other combinations can be used here too, their relative conductivity being as follows for instance:

| vacuum (reference value) | 0 |
| air | 1 |
| aluminium | 9000, |
| copper | 16,000, |
| silver | 20,000 |

The heat exchangers according to the invention can also be used as a cooling element to cool an axle if a body of material, preferably a bar, a round bar for instance, composed of the material of better thermal conductivity is essentially in contact with the axle elements to be cooled within the axle to be cooled and dissipates the heat from here to the material of poorer thermal conductivity, which is arranged behind at least one end of the axle and is there essentially in contact with the cooling medium, to which, for its part, it transfers the heat. In this case, the body of material can also be composed of sintered material. The body of material of better thermal conductivity can also be insulated from the axle elements that are not to be cooled. Such insulation can be embodied in such a way, for instance, that a bar of high thermal conductivity is arranged within an insulating axle.

A cooling-body part that rotates with the axle and has cooling ribs that curve counter to the direction of rotation is preferably arranged behind at least one end of the axle, further increasing the cooling effect, it being possible for the rotating cooling-body part itself to be made from at least two materials, namely a material of better thermal conductivity and a material of poorer thermal conductivity.

In a particularly preferred embodiment of a heat exchanger in accordance with the present invention, a Peltier element is mounted between the body of material of better thermal conductivity and the rotating cooling-body part, the cooling side of which is essentially in contact with the body of material of better thermal conductivity and the heat-emitting side of which is essentially in contact with the rotating cooling-body part, thereby further improving the dissipation of the heat.

The heat exchangers according to the invention with a sintered cooling element and a porous sintered structure can also be produced in such a way that, instead of being sintered, their granular starting material is bonded together by irradiating it with microwaves, thus forming a sinter-like porous structure, through which the cooling medium can flow.

Just as in sintering granular materials, e.g. metal powders, negative moulds of the objects to be produced, e.g. the cooling bodies, are filled with the granular material and then exposed to microwave radiation. As with sintering, the granular materials enter into bonds at their respective contact points. In contrast to sintering, however, there are fewer problems here with agglomeration. The shape of the sintering necks can be better reproduced, considerably simplifying manufacture as regards uniform quality. Unlike solid metals, metal powders tend to absorb the energy-rich waves rather than reflecting them, depending on their grain size.

This results in structures that have an even better thermal conductivity than sintered parts. The shock resistance of these parts is also improved, which is an advantage especially in areas of application in which heat exchangers are exposed to shocks, e.g. in vehicles; their life is extended and the risk of fracture falls.

However, all these embodiments are equivalent in their cooling function to originally sintered parts.

The following method is suitable for producing heat exchangers according to the invention in which the sintered parts are composed of a material of better thermal conductivity and a material of poorer thermal conductivity and even the two materials together form a porous sintered structure, with the sintering temperature of the material of better thermal conductivity being lower than or equal to the temperature of the material of poorer thermal conductivity:

A mould is first of all charged with the material of poorer thermal conductivity required for the heat exchanger. The mould is then brought to a temperature required to sinter the material of poorer thermal conductivity. The mould is then cooled to an intermediate cooling temperature; changes are then made to the mould, if required (in order to produce a structure that matches the material of better thermal conductivity). The normal ambient temperature of the air is preferably used as the intermediate cooling temperature here but it is also sufficient, and preferable when no changes are made to the mould, to cool the mould to a temperature below 200° C., preferably to about 100° C. The mould is then charged with the material of better thermal conductivity required for the heat exchanger and then brought to the temperature required to sinter the material of better thermal conductivity, it being necessary for this temperature to be lower than or equal to the maximum temperature required to sinter the material of poorer thermal conductivity. Finally, the mould can be brought to a final temperature of the method. The final temperature here is preferably the normal ambient temperature of the air.

In this method, the mould is preferably brought to one or more intermediate temperatures after being charged with material of poorer thermal conductivity in intermediate steps before the temperature required to sinter this material is reached.

It is also possible to reduce the temperature to the intermediate cooling temperature again in intermediate steps.

Similar statements apply to the sintering of the second material of better thermal conductivity. Here too, the approach to the sintering temperature and the lowering of the temperature can once again take place in intermediate steps.

Silver is preferably suitable as the material of better thermal conductivity, while copper is preferably suitable as the material of poorer thermal conductivity. In this case, the method proceeds as follows:

a mould is first of all charged with the copper required for the heat exchanger;

the mould is then brought to 1073° C. for about 12 minutes to sinter the copper. (As an alternative, it can also be brought to 1075° C. for about 10 minutes or to 1077° C. for about 8 minutes or to 1079° C. for about 6 minutes);

following this, the mould can then cool to an intermediate cooling temperature of 100° C.;

if required, changes are then made to the mould for the silver to be sintered;

the mould is then charged with the silver required for the heat exchanger;

the mould is then brought to 900° C. for about 12 minutes to sinter the silver. (As an alternative, it can also be brought to 920° C. for about 10 minutes or to 935° C. for about 8 minutes or to 950° C. for about 6 minutes.) These temperatures are lower than or equal to the temperatures required to sinter the less thermally conductive copper;

finally the mould can then cool.

In a further particularly preferred embodiment, the method according to the invention proceeds in such a way that the step for sintering the copper lasts longer at low temperature and for a shorter time at higher temperature, specifically in the following range, namely from 20 minutes at 1000° C. to 2 minutes at 1100° C., and the step for sintering the silver also lasts longer at low temperature and for a shorter time at higher temperature, specifically in the following range, namely from 20 minutes at 200° C. to 2 minutes at 990° C. The time preferably increases in inverse proportion to the decrease in temperature in the respective ranges. Naturally, this applies mutatis mutandis not only to copper and silver but also to other suitable materials of poorer and better thermal conductivity, and the temperatures have to be adapted to the respective material.

The sintering processes according to the invention are preferably carried out in a sintering furnace under a protective gas, e.g. hydrogen.

However, the sintering process can also be carried out with the sintering mould covered with charcoal, preferably low-sulphur charcoal. In this case, the charcoal is applied to the top of the mould to cover it, e.g. in the case of a closed mould with a lid. In this way, it consumes the oxygen that remains in the mould when the temperature is increased. It is namely known in the casting industry that oxygen in the melt leads to blowholes, leading to defects in the surface. The advantage of charcoal is that, where copper is used for sintering, copper does not react with carbon, unlike steel, and the charcoal keeps oxygen away during the heating process by reacting with it. However, care should be taken to ensure that the charcoal contains as little sulphur as possible since a high sulphur content can lead to fractures in the material.

The furnace used for the sintering method must have a high temperature accuracy (suggested makes including Alino Düren, Brands Düren or suitable brazing furnaces). The sintered-neck shapes (about 30% is desirable) can be influenced by means of the grain size employed for the material, the temperatures and the dwell times.

Figure 2:
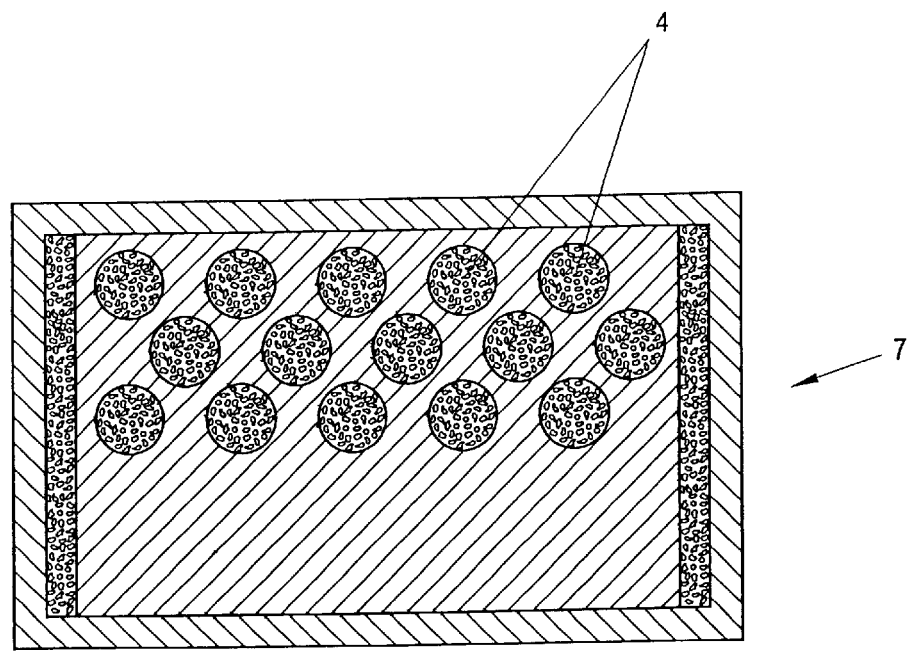
Figure 3:
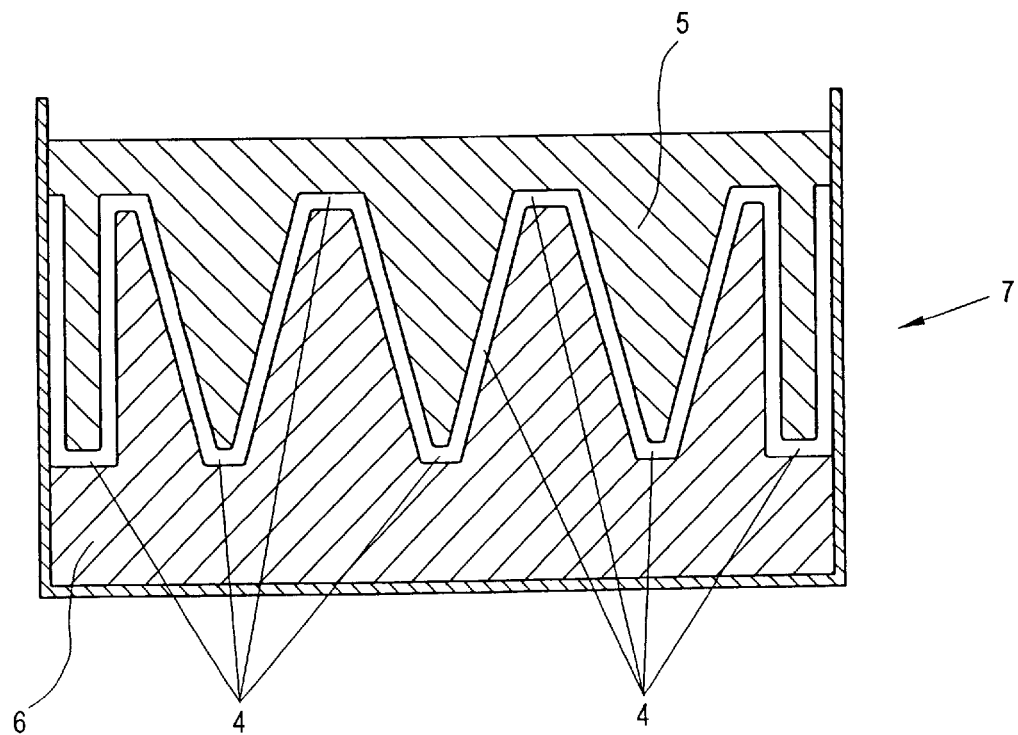
Figure 4:
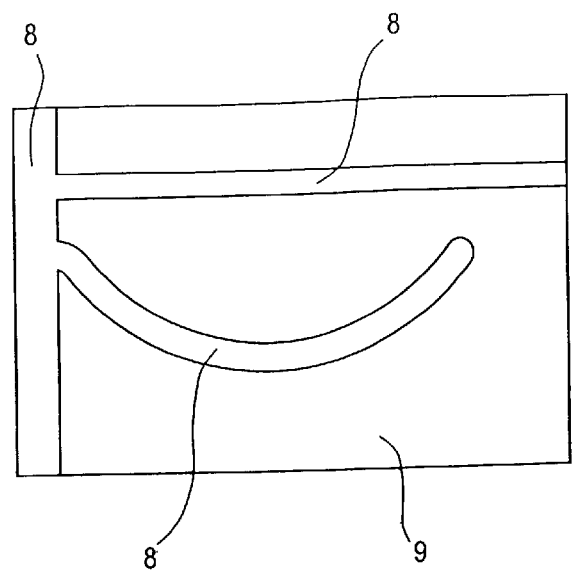
Figure 5:
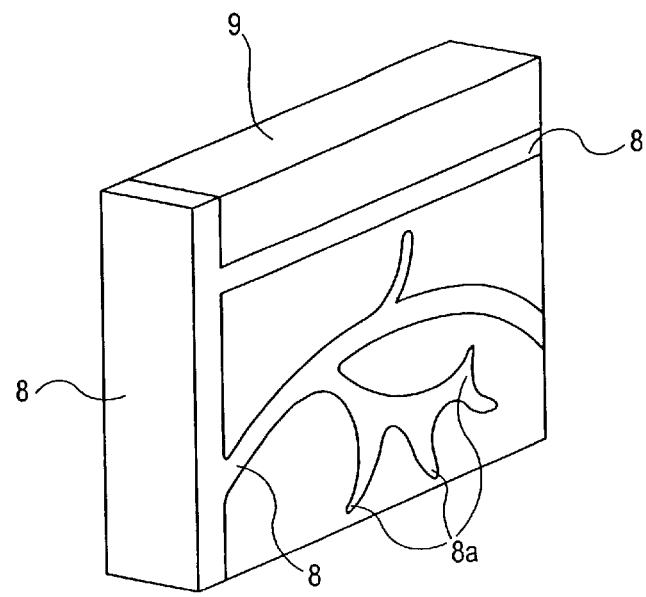
Figure 6:
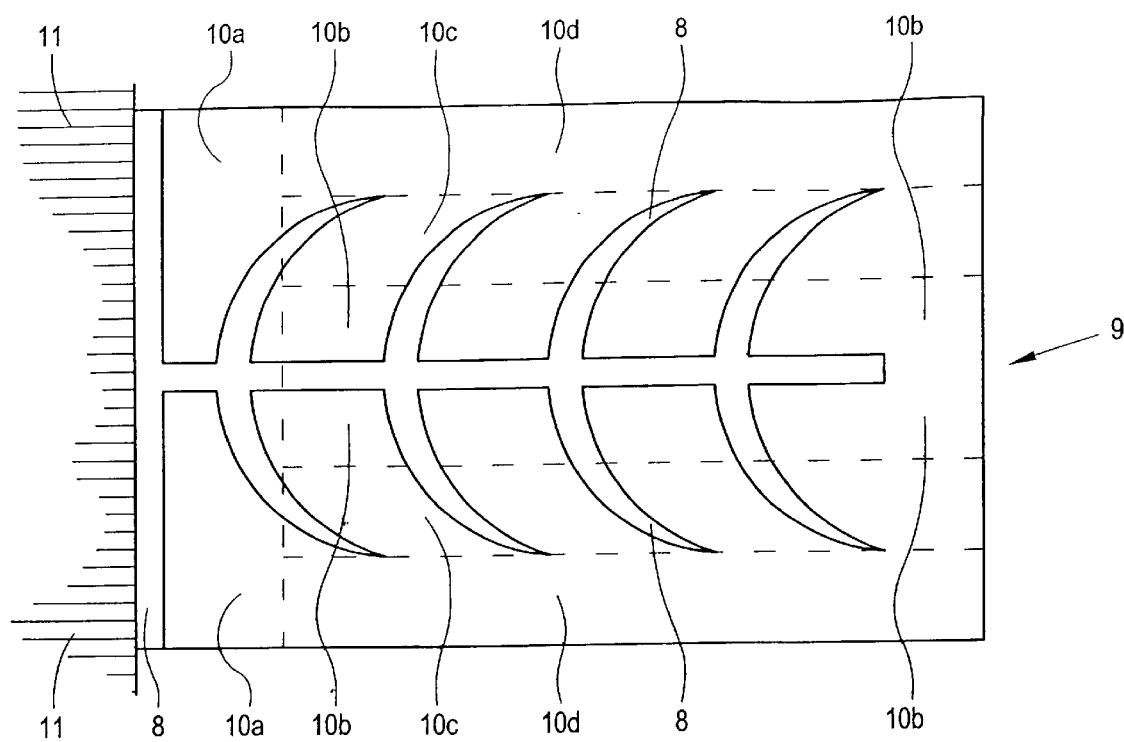
Figure 7:
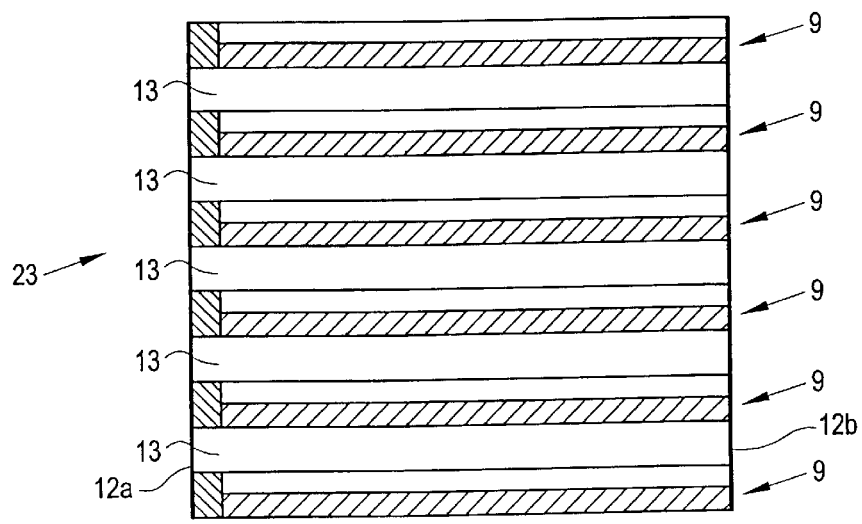
Figure 8A:
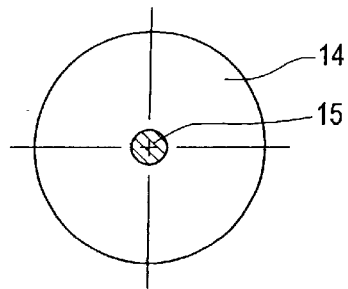
Figure 9:
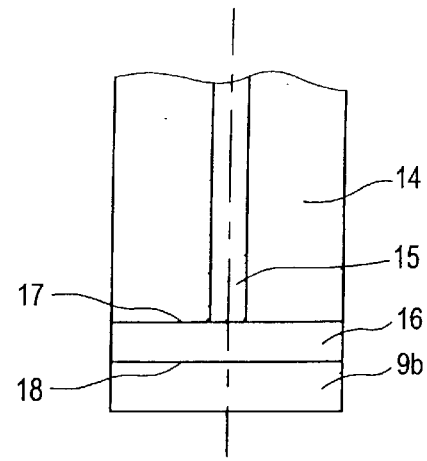
Figure 8B:
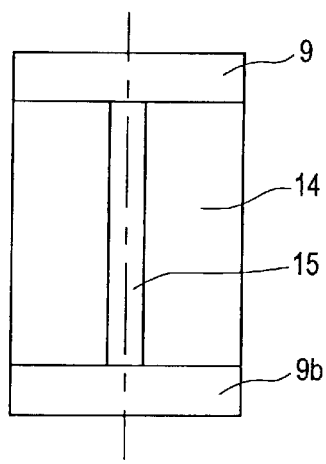
Figure 10:
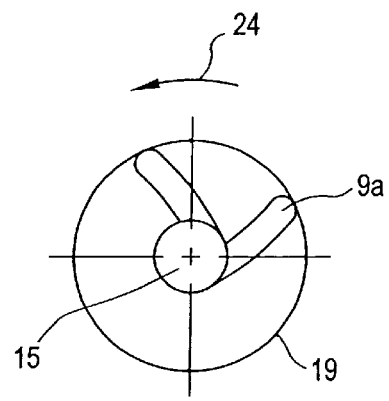

Exemplary embodiments, which are not to be taken as restrictive, are discussed below with reference to the drawing, in which:

FIG. 1 shows an example of a sintering-furnace mould in section from the side,

FIG. 2 shows a top plan view of an example of a sintering-furnace mould for the production of cooling bodies that have columns or cones or conical parts, FIG. 3 shows an example, in section from the side, of a sintering-furnace mould, which will be used to illustrate how cooling bodies are sintered from 2 materials, FIG. 4 shows a plan view of an example of a sintered cooling body composed predominantly of a material of poorer thermal conductivity, e.g. copper, FIG. 5 shows a perspective view of an example of a sintered cooling body composed predominantly of a material of poorer thermal conductivity, e.g. copper, FIG. 6 shows a plan view of a sintered cooling body, in which the sintered parts are composed of a material of better thermal conductivity (e.g. silver) and a material of poorer thermal conductivity (e.g. copper), FIG. 7 shows a heat exchanger constructed from a plurality of cooling bodies, FIGS. 8a and 8b show a heat exchanger as a cooling element for cooling an axle in side view, FIG. 9 shows another heat exchanger as a cooling element for cooling an axle using a Peltier element, FIG. 10 shows another heat exchanger as a cooling element for cooling an axle with a rotary cooling-body part that has curved ribs, and FIGS. 11 and 11a once again show another heat exchanger according to the invention for cooling an axle, which is composed of two materials.

FIG. 1 shows an example of a sintering-furnace mould in section from the side, which is charged up to a filling level 1 with the material to be sintered. A covering plate 2 can be placed on at the filling level 1, serving either for smoothing and being removed before the actual process in the furnace or itself becoming part of the cooling body. In the latter case, the plate is preferably produced from the same material as the sintered material with which the mould is charged or it is produced from a material of better thermal conductivity, preferably silver, in a second production step. In this case, the plate material of better thermal conductivity also melts into the already sintered supporting structure composed of material of poorer thermal conductivity during the sintering process. The mould furthermore has negatively shaped structures 3, in this case in the form of ribs that impart their shape to the sintered material. The sintered material itself is introduced into the space 4 left by this mould and is then processed in the furnace.

FIG. 2 shows a top plan view of an example of a sintering-furnace mould for the production of cooling bodies that have columns or cones or conical parts. In this case, the material to be sintered is introduced into the space 4 left free by this mould and thus forms the desired shape.

FIG. 3 shows an example of a sintering-furnace mould 7 in section from the side, which will be used to illustrate how cooling bodies are sintered from 2 materials. In order to produce a cooling body sintered from two materials, the material of poorer thermal conductivity, which is preferably introduced in powder form into a mould comprising a top part 5 and a bottom part 6. This is accomplished by first filling the bottom part of the mould 6 sufficiently with metal powder and then pressing the top mould part 5 into it, for example. The metal powder to be sintered is then distributed within the space 4 left free by the mould by shaking it adequately, another possible way of accomplishing this distribution process being to fill and tilt the mould. The mould charged in this way can then be heated in the furnace.

Once this first processing stage is complete, the top mould part 5 can be replaced by a new mould part, which now leaves free a new space between the body sintered in the first stage and the mould. The second material, that of better thermal conductivity, is then introduced into this, with the process continuing as for the material processed first. The second material, that of better thermal conductivity, thus uses the first material, that of poorer thermal conductivity, as a supporting structure while being sintered.

FIG. 4 shows a plan view of an example of a sintered cooling body 9 composed predominantly of a material of relatively poor thermal conductivity, e.g. copper. In addition, however, it has shaped structures (e.g. ribs) 8 composed of a material of better thermal conductivity, preferably silver, which distributes the heat to be dissipated from the medium to be cooled into the cooling body 9.

FIG. 5 shows a perspective view of an example of a sintered cooling body 9 composed predominantly of a material of poorer thermal conductivity, e.g. copper. This too has shaped structures (in this case passages) 8 composed of a material of better thermal conductivity, preferably silver, which distribute the heat to be dissipated from the medium to be cooled into the cooling body 9. In this case, the passages 8 are also curved and in turn branch into further passages, giving a branched structure with fine passage ends 8*a* which extends into the cooling body 9.

Instead of or in addition to a silver passage structure 8, a hollow-passage structure of identical or similar construction, through which a cooling medium can be introduced into the cooling body 9, is also possible.

FIG. 6 shows a plan view of a sintered cooling body 9, in which the sintered parts are composed of a material of better thermal conductivity (e.g. silver) and a material of poorer thermal conductivity (e.g. copper), and these two materials together form a porous sintered structure, and the cooling body furthermore has a shaped structure 8 composed of a material of better conductivity, which distributes the heat into the cooling body 9, the proportion of material of better thermal conductivity in the cooling body per unit volume of the sintered cooling-body parts decreasing both with increasing distance from the medium 11 to be cooled and also with increasing distance from the passage structure 8 composed of the material of better conductivity. This means that there is a particularly high proportion of the material of better thermal conductivity in zone 10*a*, which is located both in proximity to the medium 11 to be cooled and also in proximity to the passage structure 8. In zone 10*b* too, which is predominantly in the vicinity of the passage structure 8, this proportion is still high, whereas it is already smaller in zone 10*c* and finally falls to a minimum level in zone 10*d*. In this way, particularly good distribution of heat into the cooling body is achieved.

FIG. 7 shows a heat exchanger 23, which is constructed in layers from a plurality of cooling bodies 9 (of the type illustrated in FIG. 6 for example) between two boundaries 12*a* and 12*b* and in which there are between the individual cooling bodies 9 interspaces 13 through which a cooling medium, e.g. air, can be passed to the cooling bodies 9.

FIGS. 8*a* and 8*b* show a heat exchanger as a cooling element for cooling an axle 14 in side view (FIG. 8*a*) and in plan view (FIG. 8*b*), in which a body 15 of material of better thermal conductivity is essentially in contact with the axle elements to be cooled, within the axle 14 to be cooled, and dissipates the heat from here to the cooling-body part 9*b* arranged behind at least one end of the axle cooling medium, to which, for its part, it transfers the heat. The arrangement of this cooling-body part 9*b* behind at least one end of the axle ensures that the material of poorer thermal conductivity, which is essentially in contact with the cooling medium, is also behind at least one end of the axle. Here too, the cooling-body part 9*b* is designed in such a way that it has sintered parts that form a porous sintered structure through which the cooling medium can flow, sintered parts being composed of the material of better thermal conductivity and the material of poorer thermal conductivity and the sintering temperature of the material of better thermal conductivity being less than or equal to the temperature of the material of poorer thermal conductivity.

FIG. 9 shows a heat exchanger as a cooling element for cooling an axle in accordance with FIGS. 8*a*, 8*b*, a Peltier element 16 also being arranged between the body 15 of material and the cooling-body part 9*b* here to further improve heat dissipation. The cold side 17 of the Peltier element faces the body 15 of material and the warm side of the element 18 faces the cooling-body part 9*b*.

FIG. 10 shows a heat exchanger as a cooling element for cooling an axle in accordance with FIGS. 8*a*, 8*b*, the cooling-body part here being embodied as a rotating cooling-body part 9*a* with cooling ribs that curve counter to the direction of rotation of the axle and are held by a stabilizing band 19 that surrounds them at the periphery.

Figure 11:
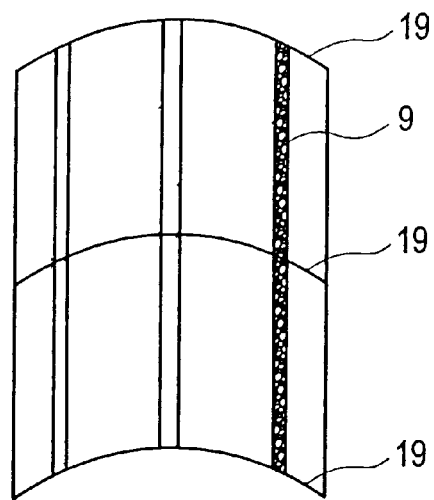
Figure 11A:
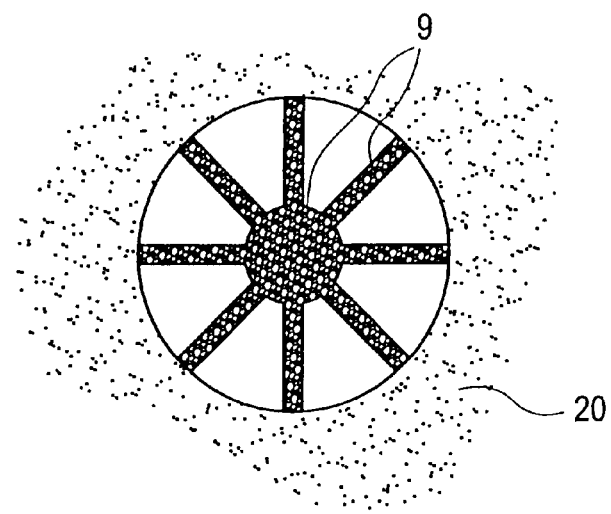

FIGS. 11 and 11*a* show a heat exchanger that has a cooling-body part 9 that is in contact with the medium to be cooled, on the one hand, and with a cooling medium 20, on the other hand, and transfers the heat of the medium to be cooled to the cooling medium 20, the cooling-body part 9 being composed of at least two materials, one of which has better thermal conductivity than the other, and the material of better thermal conductivity being essentially in contact with the axle elements to be cooled and dissipating the heat from the latter to the material of poorer thermal conductivity, which is essentially in contact with the cooling medium 20, to which for its part it transfers the heat. The structure is held together here by stabilizing bands 19.

What is claimed is:

1. Heat exchanger, which has a cooling body (9) that is in contact with a medium (11) to be cooled, on the one hand, and with a cooling medium (20), on the other hand, and transfers heat of the medium to be cooled to the cooling medium, characterized in that the cooling body is composed of at least two materials, of which one is a better conductor of heat than the other, and the material of better thermal conductivity is essentially in contact with the medium to be cooled and dissipates the heat from the latter to the material of poorer thermal conductivity, which is essentially in contact with the cooling medium, to which for its part it transfers the heat, and the cooling body furthermore has sintered parts that form a porous sintered structure through which the cooling medium can flow, sintered parts being composed of the material of better thermal conductivity and of the material of poorer thermal conductivity, and the sintering temperature of the material of better thermal conductivity being less than or equal to the temperature of the material of poorer thermal conductivity.

2. Heat exchanger according to claim 1, characterized in that metals are used as the heat-conducting materials, with a metal that is more noble than the material of poorer thermal conductivity being used as the material of better thermal conductivity, and a less noble metal than the material of better thermal conductivity being used as the material of poorer thermal conductivity.

3. Heat exchanger according to claim 2, characterized in that silver is used as the material of better thermal conductivity and copper is used as the material of poorer thermal conductivity.

4. Heat exchanger according to claim 1 characterized in that a proportion of the material of better thermal conductivity in the cooling body per unit volume of the sintered cooling-body parts decreases with increasing distance from the medium (11) to be cooled.

5. Heat exchanger according to claim 1, characterized in that the cooling body has a shaped structure composed of the material (8) of better conductivity, which distributes the heat into the cooling body (9).

6. Heat exchanger according to claim 5, characterized in that a proportion of material of better conductivity in the cooling body per unit volume of the sintered cooling-body parts decreases with increasing distance from the shaped structure (9) composed of the material of better conductivity.

7. Heat exchanger according to claim 1, characterized in that the cooling body has a passage structure (8, 8a) for guiding the cooling medium, which distributes the cooling medium in the cooling body.

8. Heat exchanger according to claim 7, characterized in that the passage structure has curved passages.

9. Heat exchanger according to claim 7, characterized in that the passage structure (8) has passages from which, in turn, passages (8a) branch off.

10. Heat exchanger according to claim 1 as a cooling element for cooling an axle (14), characterized in that a body (15) composed of the material of better thermal conductivity is essentially in contact with the axle elements to be cooled within the axle to be cooled and dissipates the heat from here to the material of poorer thermal conductivity, which is arranged behind at least one end of the axle and is there essentially in contact with the cooling medium, to which, for its part, it transfers the heat.

11. Heat exchanger according to claim 9, characterized in that a cooling-body part (9a) that has cooling ribs curved counter to e direction of rotation and rotates with the axle is arranged behind at least one end of the axle.

12. Heat exchanger according to claim 11, characterized in that a Peltier element (16) is mounted between the body (15) of material of better thermal conductivity and the rotating cooling-body part (9a), the cooling side (17) of which is essentially in contact with the body (15) of material of better thermal conductivity and a heat-emitting side (18) of which is essentially in contact with the rotating cooling-body part (9a), thereby improving the dissipation of the heat.

13. Method for producing a heat exchanger, which has the following steps:
(i) a mould (7) is first of all charged with material of poorer thermal conductivity required for the heat exchanger;
(ii) the mould is then brought to a temperature required to sinter the material of poorer thermal conductivity;
(iii) the mould is then brought to an intermediate cooling temperature;
(iv) changes are then made to the mould, if required;
(v) the mould is then charged with the material of better thermal conductivity required for the heat exchanger;
(vi) the mould is then brought to the temperature required to sinter the material of better thermal conductivity, it being necessary for this temperature to be lower than or equal to the temperature required to sinter the material of poorer thermal conductivity;
(vii) finally the mould is brought to a final cooling temperature.

14. Method according to claim 13, to produce a heat exchanger, characterized in that, after step (i) and before step (ii), the mould (7) is brought to one or more intermediate temperatures in one or more intermediate steps.

15. Method according to claim 13, to produce a heat exchanger, characterized in that, after step (ii) and before step (iii), the mould (7) is brought to one or more intermediate temperatures in one or more intermediate steps.

16. Method according to claim 13, to produce a heat exchanger, characterized in that, after step (v) and before step (vi), the mould (7) is brought to one or more intermediate temperatures in one or more intermediate steps.

17. Method according to claim 13, to produce a heat exchanger, characterized in that, after step (vi) and before step (vii), the mould (7) is brought to one or more intermediate temperatures in one or more intermediate steps.

18. Method according to claim 13, to produce a heat exchanger, characterized in that silver is chosen as the material of better thermal conductivity and copper is chosen as the material of poorer thermal conductivity, and the method has the following steps:
(i) a mould (7) is first of all charged with the copper required for the heat exchanger;
(ii) the mould is then brought to the temperature required to sinter copper, in a range of about 1000° C. to 1100° C., preferably 1073° C. to 1079° C.;
(iii) the mould is then brought to an intermediate cooling temperature of 100° C.;
(iv) changes are then made to the mould, if required;
(v) the mould is then charged with the silver required for the heat exchanger;
(vi) the mould is then brought to the temperature required to sinter the silver, in a range of 200° C. to 990° C., preferably of about 900° C. to 950° C., these temperatures in a range of 200° C. to 990° C. being lower than or equal to the temperatures in a range of 1000° C. to 1100° C. required to sinter the less thermally conductive copper;
(vii) finally the mould is brought to a final cooling temperature.

19. Method according to claim 18, to produce a heat exchanger, characterized in that the temperatures in a range of 1073° C. to 1079° C. in step (ii) are held for about 6 to 12 minutes, and the temperatures in a range of 900° C. to 950° C. in step (vi) are likewise held for about 6 to 12 minutes.

20. Method according to claim 18, to produce a heat exchanger, characterized in that step (ii) lasts longer at low temperature and for a shorter time at higher temperature, specifically in the following range, namely from 20 minutes at 1000° C. to 2 minutes at 1100° C., and step (vi) also lasts longer at low temperature and for a shorter time at higher temperature, specifically in the following range, namely from 20 minutes at 200° C. to 2 minutes at 990° C.

21. Method according to claim 13, to produce a heat exchanger, characterized in that the sintering process takes place under a protective gas.

22. Method according to claim 21, to produce a heat exchanger, characterized in that hydrogen is used as the protective gas.

23. Method according to claim 21, to produce a heat exchanger, characterized in that the sintering process is carried out with the sintering mould covered with low-sulphur charcoal.

* * * * *